United States Patent
Bao et al.

(10) Patent No.: US 9,691,655 B1
(45) Date of Patent: Jun. 27, 2017

(54) ETCH STOP IN A DEP-ETCH-DEP PROCESS

(71) Applicant: International Business Machines Corporation, Armonk, NY (US)

(72) Inventors: Ruqiang Bao, Wappingers Falls, NY (US); Keith Kwong Hon Wong, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/969,580

(22) Filed: Dec. 15, 2015

(51) Int. Cl.
| | | |
|---|---|---|
| H01L 21/76 | (2006.01) | |
| H01L 21/768 | (2006.01) | |
| H01L 29/66 | (2006.01) | |
| H01L 29/49 | (2006.01) | |
| H01L 49/02 | (2006.01) | |
| H01L 21/306 | (2006.01) | |
| H01L 23/522 | (2006.01) | |
| H01L 29/78 | (2006.01) | |
| H01L 23/532 | (2006.01) | |
| H01L 21/283 | (2006.01) | |

(52) U.S. Cl.
CPC ...... *H01L 21/76831* (2013.01); *H01L 21/283* (2013.01); *H01L 21/30604* (2013.01); *H01L 21/76832* (2013.01); *H01L 21/76879* (2013.01); *H01L 21/76892* (2013.01); *H01L 23/5226* (2013.01); *H01L 23/53266* (2013.01); *H01L 28/60* (2013.01); *H01L 29/4958* (2013.01); *H01L 29/66477* (2013.01); *H01L 29/78* (2013.01)

(58) Field of Classification Search
CPC ...................... H01L 23/5226; H01L 21/76831
See application file for complete search history.

(56) References Cited

U.S. PATENT DOCUMENTS

| | | | |
|---|---|---|---|
| 7,064,066 B1 | 6/2006 | Mets et al. | |
| 7,608,535 B2 | 10/2009 | Kim | |
| 8,193,081 B2 | 6/2012 | Lim et al. | |
| 2004/0262760 A1 | 12/2004 | Huang | |
| 2010/0216287 A1 | 8/2010 | Tsai et al. | |
| 2013/0224927 A1 | 8/2013 | Schmidbauer et al. | |
| 2015/0024592 A1* | 1/2015 | Chandrashekar . H01L 21/67207 438/675 |
| 2015/0132953 A1 | 5/2015 | Nowling et al. | |
| 2015/0137373 A1 | 5/2015 | Zhang et al. | |
| 2015/0279837 A1* | 10/2015 | Lee ........................ H01L 27/088 257/392 |
| 2016/0133472 A1* | 5/2016 | Kim .................. H01L 21/28088 438/283 |

* cited by examiner

*Primary Examiner* — Matthew Reames
(74) *Attorney, Agent, or Firm* — Cantor Colburn LLP; Bryan Bortnick

(57) ABSTRACT

Described herein is a method of forming semiconductor devices. The method comprises depositing an etch stop layer of titanium aluminum carbide in a cavity of a semiconductor device; depositing a first layer of metal on the etch stop layer; etching the first layer of metal to create an etch-modified surface of the first layer of metal; and depositing a second layer of metal on the etch-modified surface of the first layer of metal.

19 Claims, 7 Drawing Sheets

ETCH STOP IN A DEP-ETCH-DEP PROCESS

BACKGROUND

For more than three decades, the continued miniaturization of silicon metal oxide semiconductor field effect transistors (MOSFETs) has driven the worldwide semiconductor industry. Various hurdles to continued scaling have been predicted for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, methods for improving performance without scaling have gained increasing importance.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

The finFET is a type of MOSFET. The finFET is a double-gate or multiple-gate MOSFET device that mitigates the effects of short channels and reduces drain-induced barrier lowering. The "fin" refers to the narrow channel between source and drain regions. A thin dielectric layer on either side of the fin separates the fin channel from the gate.

SUMMARY

Described herein is a method of forming semiconductor devices. The method comprises depositing an underlying layer in a cavity of a semiconductor device; depositing an etch stop layer of titanium aluminum carbide on the underlying layer; depositing a first layer of metal on the etch stop layer; etching the first layer of metal to create an etch-modified surface of the first layer of metal; and depositing a second layer of metal on the etch-modified surface of the first layer of metal.

Also described herein is a method comprising creating a cavity in a semiconductor device; depositing an underlying layer in the cavity; depositing an etch stop layer of titanium aluminum carbide on the underlying layer; depositing a first layer of tungsten on the etch stop layer; etching the first layer of tungsten to create an etch-modified surface of the first layer of tungsten; and depositing a second layer of tungsten on the etch-modified surface of the first layer of tungsten.

Also described herein is a semiconductor device comprising a filled feature wherein the filled feature comprises an etch stop layer comprising titanium aluminum carbide disposed between and in direct contact with an underlying layer and a metal fill.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing features are apparent from the following detailed description taken in conjunction with the accompanying drawings in which:

DETAILED DESCRIPTION

Figure 1:
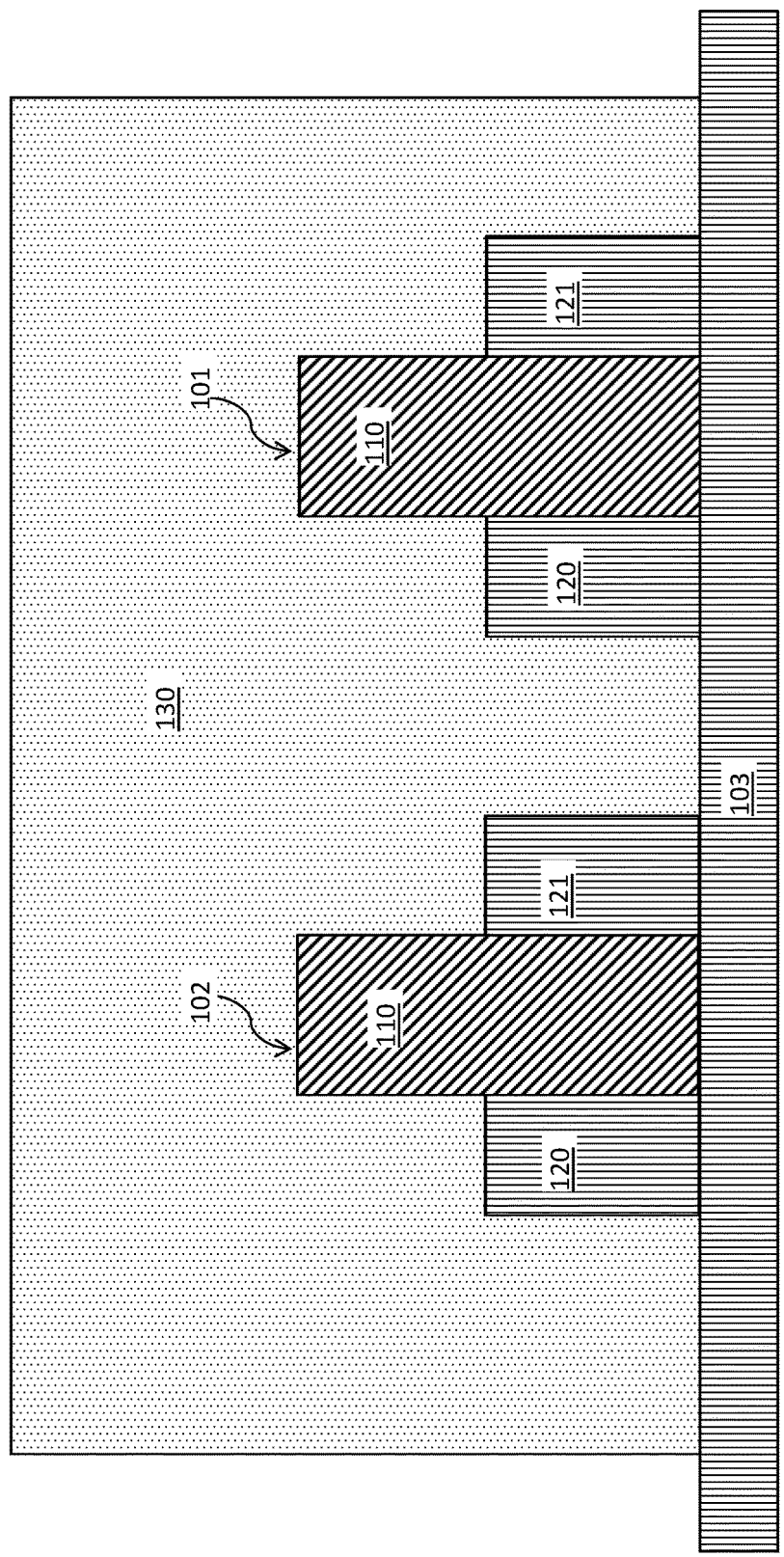
FIG. 1 shows a semiconductor device prior to forming a cavity.

Continuing scaling in manufacturing of complementary-metal-oxide-semiconductor (CMOS) transistors such as transistors with replacement-metal-gate (RMG), and of semiconductor devices in general including interconnects, has frequently led to situations where trenches and via holes of high aspect ratio need to be filled up with conductive material and/or metal element to form, for example, interconnects and/or contacts. Conventional approaches of filling, for example, a deep trench have been found ineffective, often resulting in pinches at the opening of the trench which ultimately cause voids being formed inside the trench.

Recently, an "extreme fill" process has been developed to mitigate the above ineffectiveness and/or problem relating to metal fill in high aspect ratio trenches and via holes. Particularly, this extreme fill process is a deposition-etching-deposition ("dep-etch-dep" in short) process during which metal is first deposited in, for example, a high aspect ratio trench which is then followed by an etching process designed to re-open up and smooth out surface of deposited metal. A second metal deposition is subsequently performed that typically finishes or completes the process of metal fill in the trench. In situations where thick metal fill is needed or desirable, the dep-etch-dep process may be repeated until the entire feature is filled.

However, the above described dep-etch-dep process has its drawbacks. The etch step can affect the partially filled cavity inconsistently, particularly when there is an underlying layer which has an overhang. An overhang is an excess of material at the opening of a cavity, typically a trench or via, resulting from a deposition process. The metal fill material on the overhang can etch faster than the metal fill material in the trench, resulting in etching of the underlying overhang material and the creation of defects. In addition, trench length can affect the etch rate of the metal fill material. When both long and short trenches are present it is difficult to fill them simultaneously due to differences in etch rate. The etch rate for a long trench is higher than for a short trench. The underlying layer in a long trench may be etched completely in order to meet the etch amount required for short trench. When the underlying layer is used as the wetting layer or adhesion layer for second step deposition, the complete removal leads to a problem when depositing the desired material on top of the underlying layer.

Described herein is a method to overcome these issues by employing titanium aluminum carbide as an etch stop material for the metal fill material.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In some embodiments, the methods and structures disclosed herein are related to forming semiconductor devices. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. For example, when the dominant carrier concentration is electrons, the semiconductor device is referred to as being an n-type semiconductor device; and when the dominant carrier concentration is holes, the semiconductor device is referred to as being a p-type semiconductor device.

In some embodiments, the semiconductor devices suitable for use with methods and structures disclosed herein are field effect transistors (FETs). A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region underlying the gate structure and between the source and drain of a semiconductor device that becomes conductive when the semiconductor device is turned on.

It is noted that the semiconductor devices for use with the methods and structures disclosed herein are not limited to only field effect transistors. Any planar semiconductor device is suitable for use with the methods and structures that are disclosed herein. The term "planar" as used to describe a semiconductor device orientation denotes that the direction of charge carriers from the source region to the drain region of the semiconductor device is along a plane that is parallel to the upper surface of the substrate, wherein a gate structure is present on the upper surface of the substrate. For example, the planar semiconductor device that is suitable for use with the present application includes junction field effect transistors (JFET), Schottky barrier devices, bipolar junction transistors having the appropriate planar orientation, flash memory devices, high-electron-mobility-transistor (HEMT), and combinations thereof.

FIGS. 1-7 show an exemplary use of the method. While this example is specific to making a gate contact the method can be applied to other metal structures in semiconductor devices such as a metal gate, a metal contact or a backend-of-the-line (BEOL) interconnect, and deep trench capacitors. These structures can share similar process steps including creating an cavity, depositing one or more liners the compositions of which can vary by structure, depositing the etch stop layer and filling with a metal. As used herein the term "liner" describes a material deposited in a cavity. The liner may be deposited or formed on all of the interior surfaces of the cavity or only a portion of the interior surface of the cavity. For example, when forming a metal gate stack a high-k dielectric layer and at least one additional layer such as a titanium-nitride layer may be deposited, the etch stop layer deposited and then the gate filled with high conductive metal like W. A metal gate stack may compromise one or more of TiN, TiC, TaC, Ti, Al, TiAl, W, Ni, Nb, NbAl or any combination thereof. When making a gate contact the cavity is created, a liner is deposited followed by the etch stop layer and metal fill. In these cases the metal fill is achieved using a metal deposition step followed by an etching step and another metal deposition step. The etch and deposition steps can be repeated as many times as needed to fill the cavity. The presence of an etch stop layer prevents etching of the underlying materials and permits etching of a variety of sizes of cavities, such as long and short trenches, simultaneously without additional process steps. The method described herein is not restricted to a single type of device. The semiconductor device can be a planar device, finFET device, nanowire device, gate around device, vertical device, tunneling device, or a thin film transistor. This method is broadly applicable to any semiconductor device which employs metal fill of a cavity during production.

FIG. 1 is a cross-sectional side view of a first semiconductor device 101 and a second semiconductor device 102 formed over a substrate 103. The substrate 103 is shown for contextual purposes and depends on the type of transistor. For example, when transistors are finFET or nanowire devices, the substrate 103 includes fins or nanowires. When the transistors are planar devices, the substrate 103 is a semiconductor material with shallow trench isolation (STI) regions between in the first semiconductor device and the second semiconductor device. The substrate 103 may further include junction isolations. The semiconductor device 101 includes a gate stack 110, a source region 120, and a drain region 121. The gate stack 110 includes high-k metal gates formed, for example, by filling a dummy gate cavity (not shown) with one or more high-k dielectric materials, one or more work function metals, and one or more metal gate conductor materials. The gate stack includes high-k metal gates formed, for example, by filling a dummy gate cavity (not shown) with one or more high-k dielectric materials, one or more workfunction metals, and one or more metal gate conductor materials.

The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between the NFET 101 and the PFET 102. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, metal nitrides or any combination thereof.

A conductive metal is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, ALD, plating, thermal or e-beam evaporation, and sputtering.

A planarization process, for example, chemical mechanical planarization (CMP), is performed to polish the surface of the conductive gate metal.

An inter-level dielectric (ILD) layer 130 is formed over and around the gate stack 110 and source and drain regions 120, 121. The ILD layer 130 may be formed from, for example, a low-k dielectric oxide, including but not limited to, spin-on-glass, a flowable oxide, a high density plasma oxide, borophosphosilicate glass (BPSG), or any combination thereof. The ILD layer 130 may further comprise a liner (e.g., silicon nitride) (not shown) that is deposited before an oxide. The ILD layer 130 is deposited by a suitable deposition process, including, but not limited to CVD, PVD, plasma enhanced CVD, atomic layer deposition (ALD), evaporation, chemical solution deposition, or like processes.

Figure 2:
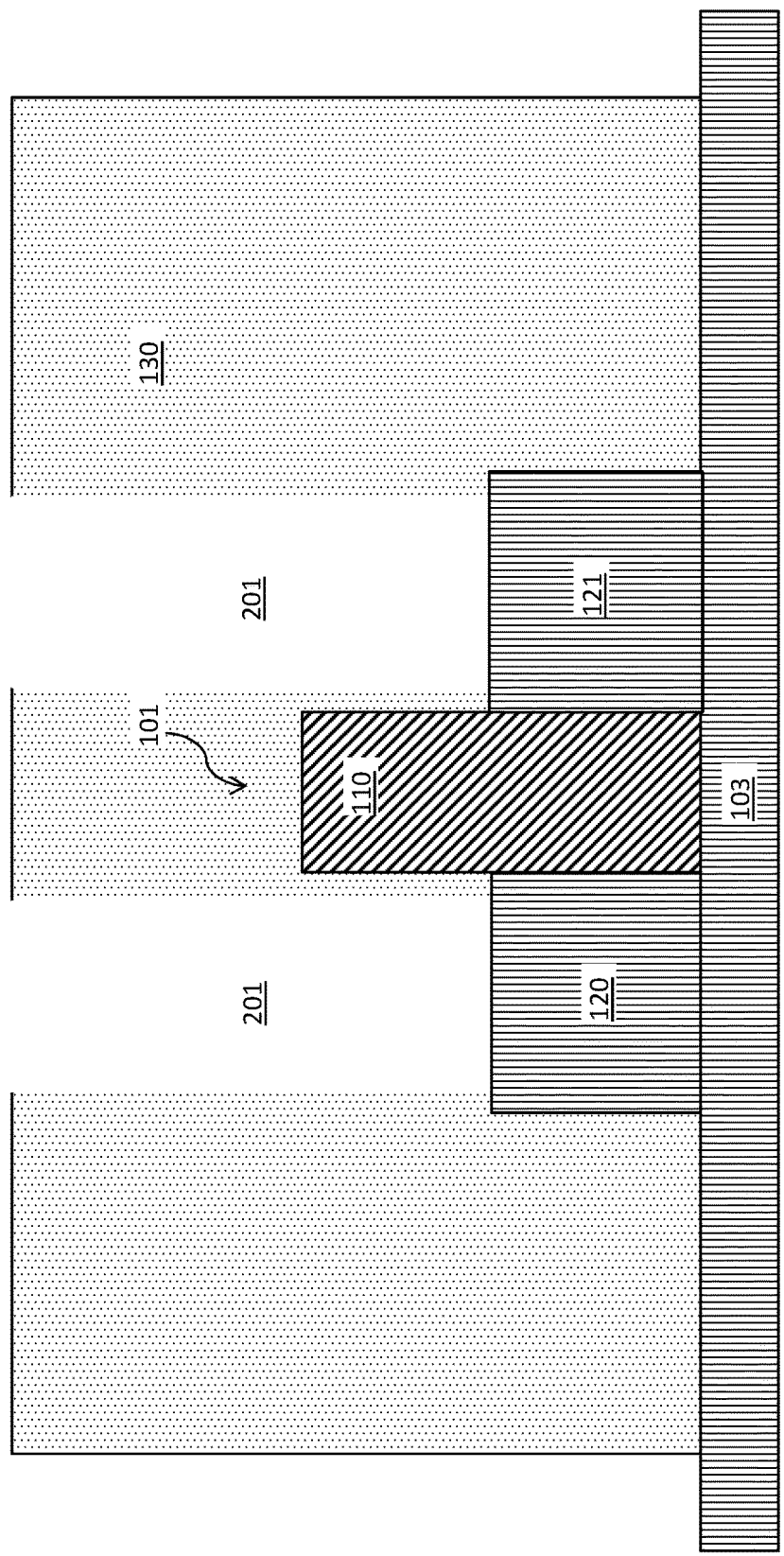
FIG. 2 shows the device of FIG. 1 after forming two cavities in the form of two trenches.

For simplicity the remainder of the drawings will depict a single semiconductor device although it is recognized that the method is applicable to multiple semiconductor devices. FIG. 2 is a cross-sectional side view after forming source/drain contact trenches 201 over source and drain regions 120, 121. The contact trenches 201 are formed by performing a patterning and etching process to remove the ILD layer 130 material down to the level of the source and drain regions 120, 121. The contact trenches 201 may be formed by depositing a mask (not shown), for example, a photoresist, over the ILD layer 130. The mask is patterned over the source and drain regions 120, 121. The pattern is transferred into the ILD layer 130 by removing the ILD layer 130 material down to the level of the source/drain regions. The ILD layer 130 material may be removed by a suitable etching process, for example, a reactive ion etch (RIE) process. The mask can be removed after forming the contact trenches 201.

The width of the contact trenches 201 may generally vary and is not intended to be limited. In one aspect, the width of the contact trenches 201 is 15 to 100 nm. In another aspect, the width of the contact trenches 201 is 20 to 50 nm. Trench 201 may be a high aspect ratio trench. High aspect ratio trench, as used herein, describes a trench having a height to width ratio of 5:1 or greater. In some embodiments the high aspect ratio trench has a height to width ratio of 10:1.

Figure 3:
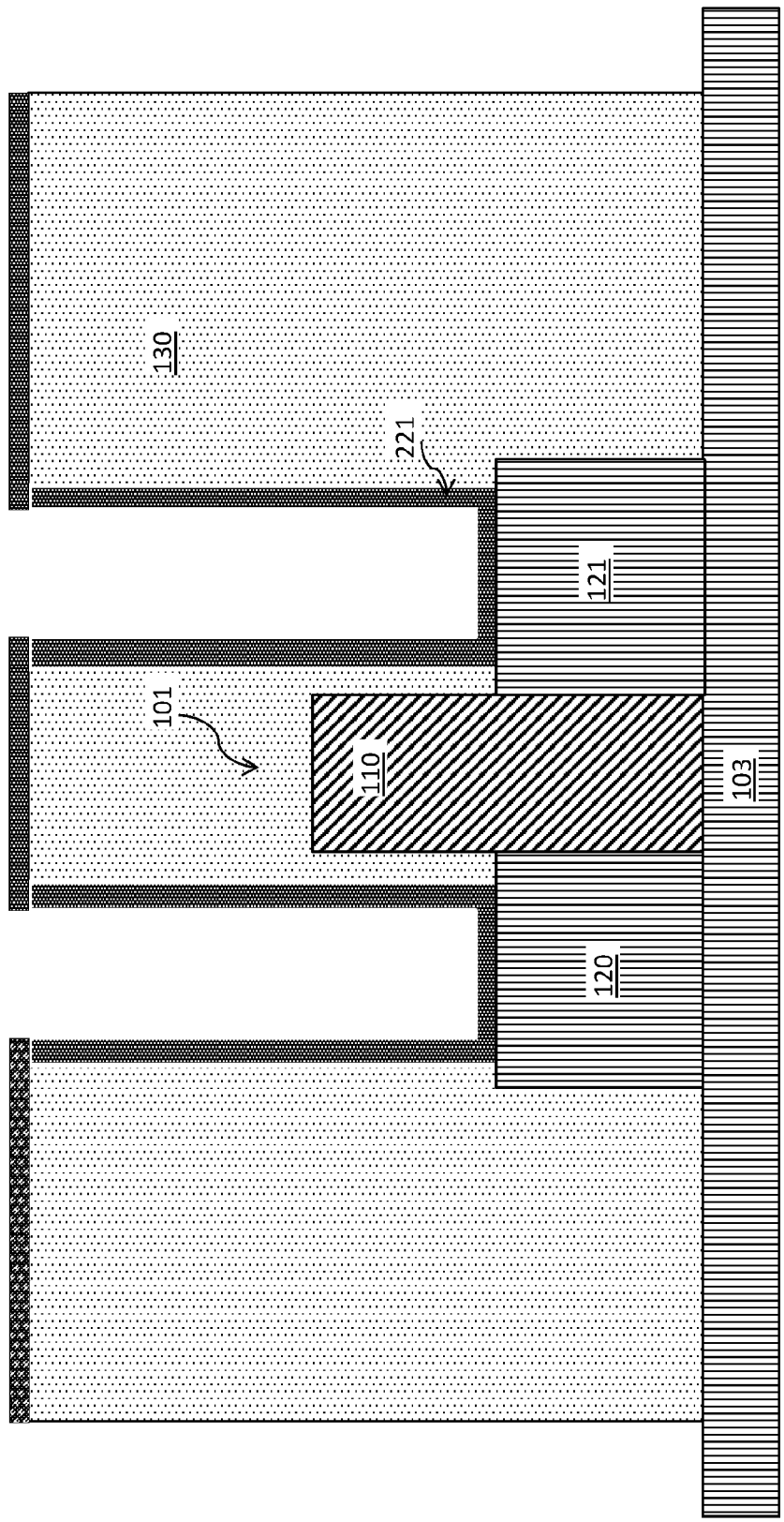
FIG. 3 shows the device of FIG. 2 after the deposition of a liner.

FIG. 3 is a cross-sectional side view after depositing a liner 221 within the contact trenches 201. The liner 221 may be a bilayer liner (not shown) or a single layer liner. The liner 221 includes any material(s) that provide a low contact resistance (e.g., a contact resistance lower than $1 \times 10^{-8}$ ohm·cm$^2$) when deposited on the source/drain of one type of transistor. Non-limiting examples of suitable low contact resistance materials include titanium and titanium nitride. In one embodiment, the liner 221 includes a first layer of titanium and a second layer of titanium nitride. Other non-limiting examples of suitable materials for the liner 221 include cobalt, titanium, cobalt titanium, nickel, platinum, nickel platinum titanium, or any combination thereof. In some embodiments a titanium containing material is adjacent to the etch stop layer. The one or more layers/films making up the liner 221 may be formed by a chemical vapor deposition process (CVD), atomic layer deposition (ALD), physical vapor deposition (PVD), or other suitable process. When the liner 221 includes more than one layer or film, the layers may be formed in separate reaction chambers or in an integrated reaction chamber.

The total thickness of the liner 221 may generally vary and is not intended to be limited. In some aspects, the total thickness of the liner 221 is 2 to 15 nm. In some other aspects, the total thickness of the liner 221 is 3 to 6 nm. The thickness of the liner is chosen to allow sufficient space for the subsequent etch stop layer and metal fill in the cavity.

Figure 4:
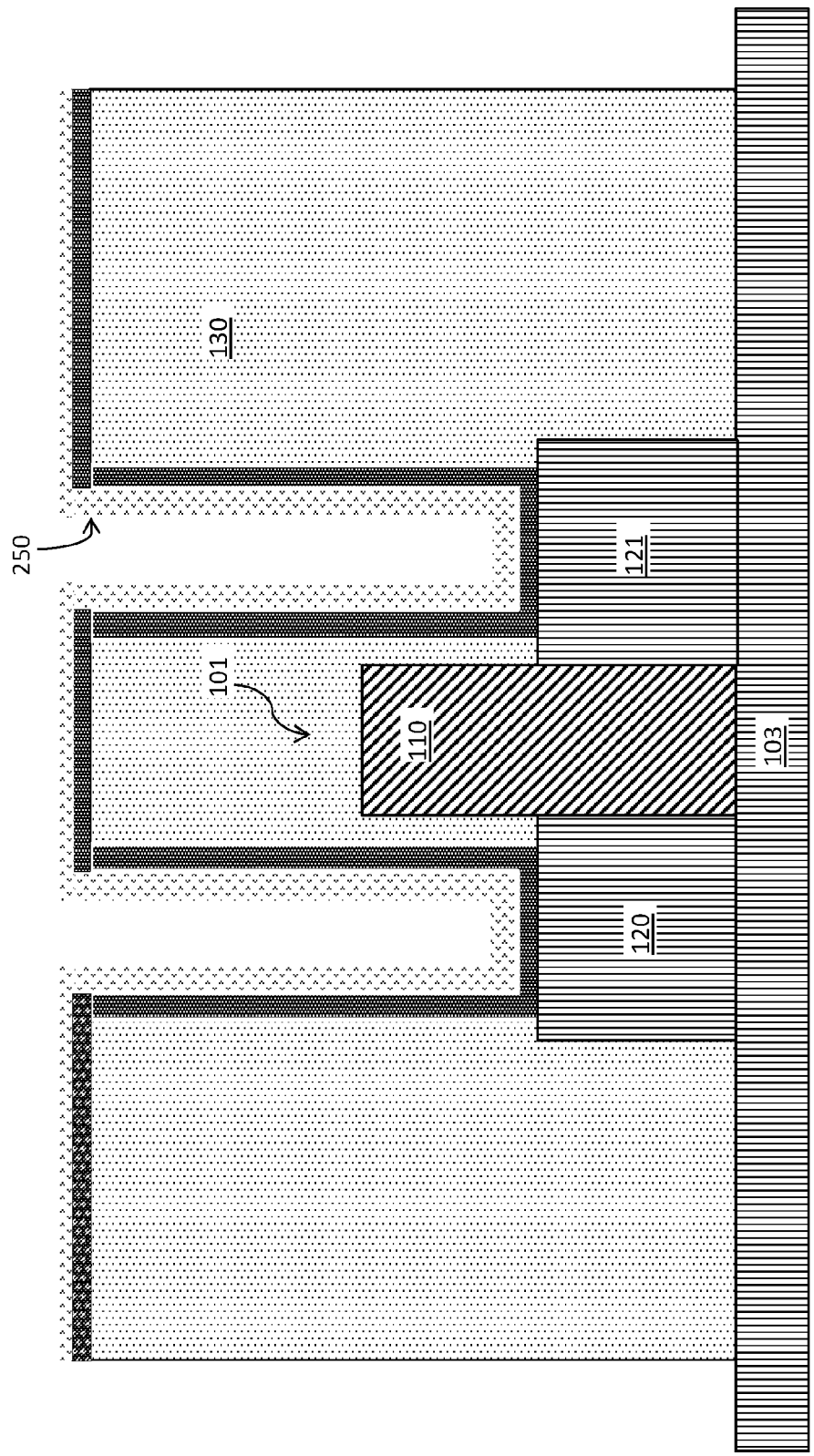
FIG. 4 shows the device of FIG. 3 after the deposition of the etch stop layer.

FIG. 4 is a cross-sectional side view after depositing the titanium aluminum carbide etch stop layer 250. The etch stop layer 250 can be deposited by ALD, CVD or PVD. The etch stop layer 250 thickness can vary and is not intended to be limited except by practical considerations such as having sufficient thickness to prevent etching of the layer underneath it and leaving sufficient room in the cavity for the metal fill. In some aspects the thickness of etch stop layer 250 is 0.5 to 10 nanometers. In some other aspects the thickness of etch stop layer is 1 to 3 nanometers.

Figure 5:
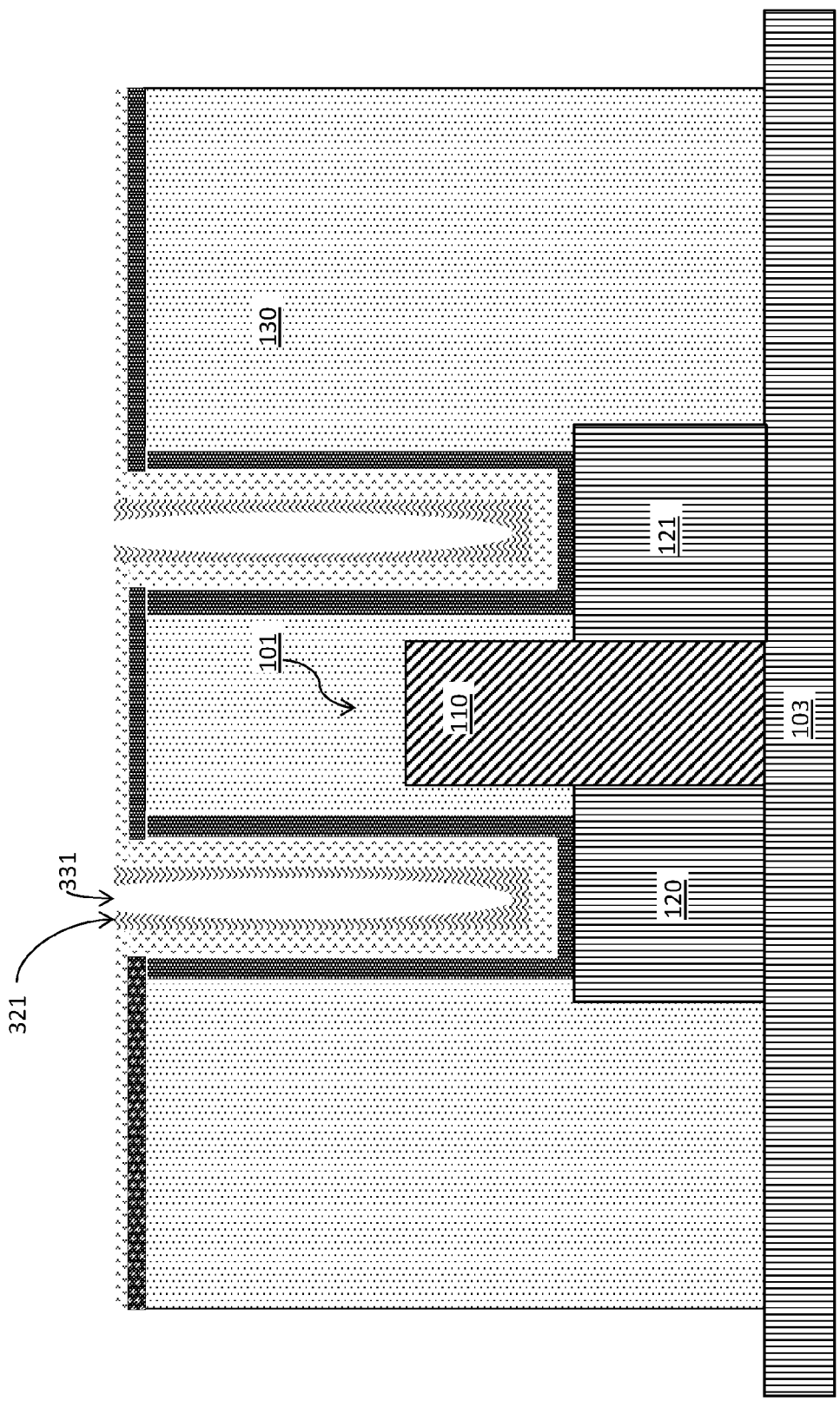
FIG. 5 shows the device of FIG. 4 after the deposition of the first metal layer. The figure shows the narrowed opening to the cavity resulting from deposition.

FIG. 5 is a cross-sectional side view after depositing a first layer of metal 321 on the etch stop layer. Non-limiting examples of suitable metals include aluminum, platinum, fold, tungsten, titanium or any combination thereof. In some embodiments the metal is tungsten. The metal may be deposited a known deposition method, for example, chemical vapor deposition (CVD), plasma-enhanced chemical vapor deposition (PECVD), atomic layer deposition (ALD), physical vapor deposition (PVD), plating, thermal or e-beam evaporation, and sputtering. The first metal deposition may leave a small opening 331 and the opening 331 may be particularly small in locations proximal to the top or upper portions of the trench 201 due to a phenomenon commonly know as pinch caused during deposition of the first layer of metal.

Figure 6:
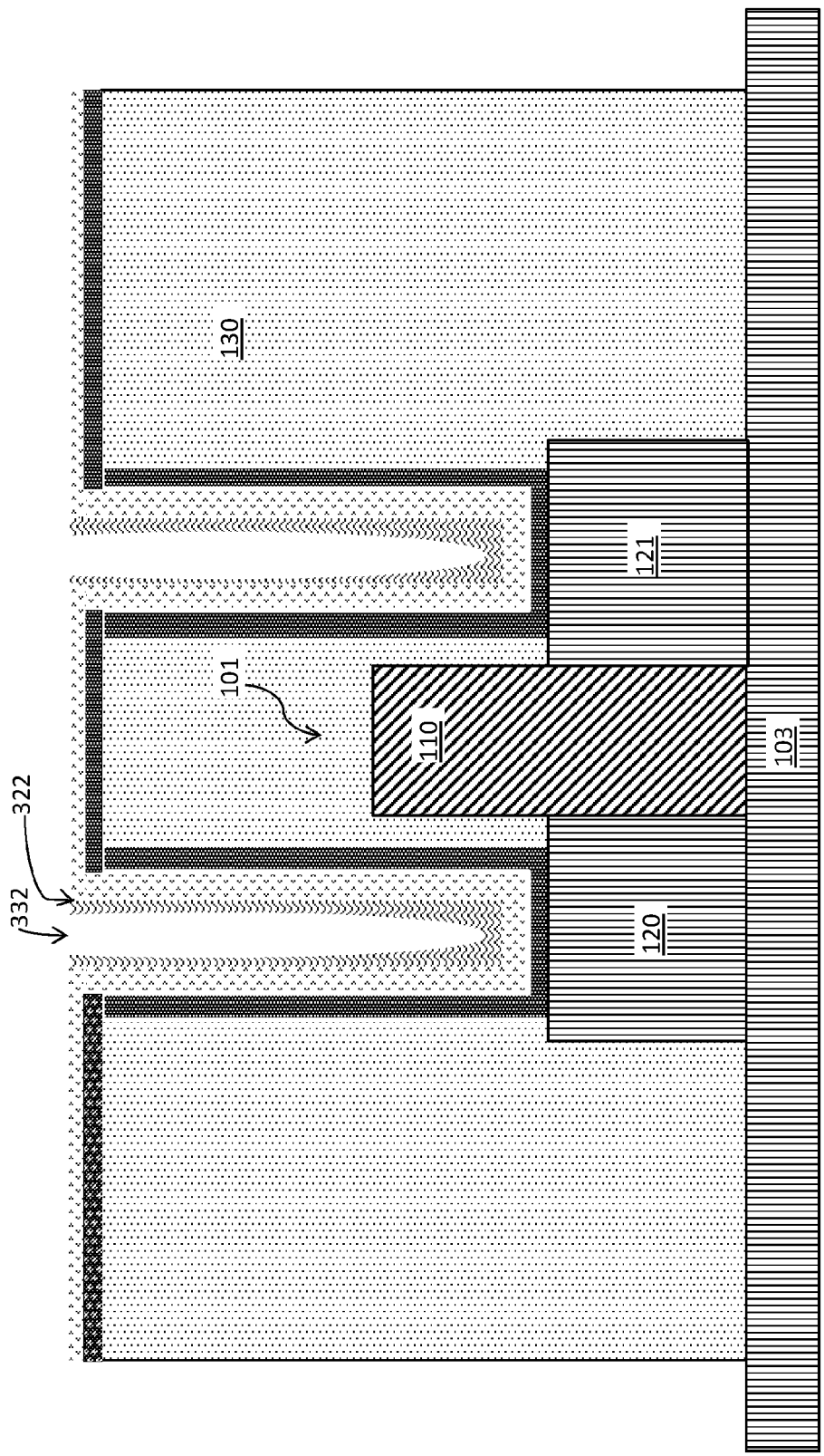
FIG. 6 shows the device of FIG. 5 after etching. The device has a wider opening at the top of the cavity compared to FIG. 5.

After the initial or first deposition step, an anisotropic etching process, aided by the etching dynamic of the trench profile, may be applied to remove some of the deposited metal, particularly around the top or upper portion of trench 201. This anisotropic etching process may involve remotely generated plasma under the environment of the nitride containing gas $NF_3$. The anisotropic etching process may transform the deposited metal layer 321 into an etching-modified metal layer 322 with a new opening 332 which is wide at the top and narrow at the bottom as is shown in FIG. 6.

The etching process does not reach to or affect the liner 221 due to the presence of the etch stop layer comprising titanium aluminum carbide. The etch stop layer prevents the formation of defects such as volcanoes in the metal fill. The etch stop layer allows the simultaneous etching and filling of long and short trenches.

The method may include the optional application of a surface treatment step (not shown) after the anistropic etching process to prepare the top surface of the etching-modified metal layer 322 for a follow-up second metal deposition step. More specifically, the surface treatment step may include, according to one embodiment, subjecting etching-modified surface of metal layer 322 to an environment of mixed gases. The mixture of gases may be $B_2H_6$ mixed with $WF_6$ or silane mixed with $WF_6$. The treatment may be performed in a chamber for about 10 seconds or less at a temperature of 200 to 400° C. Gases $B_2H_6$ and $WF_6$ or silane and $WF_6$ may be individually guided into and mixed inside the change where the treatment of the etching-modified metal surface is performed.

Alternatively the surface treatment step may include subjecting etching-modified metal surface to alternate pulse gases of different types performed in an atomic-layer deposition (ALD) process. For example, etching-modified metal surface may be subjected to or exposed to a pulse gas of $B_2H_6$ (or silane) first and then to pulse gas of $WF_6$. The etching-modified surface can be subject to multiple cycles of pulse gases. As used herein, pulse gas means a short period of duration of gas. The surface treatment step is particularly useful when the deposited metal is tungsten.

Figure 7:
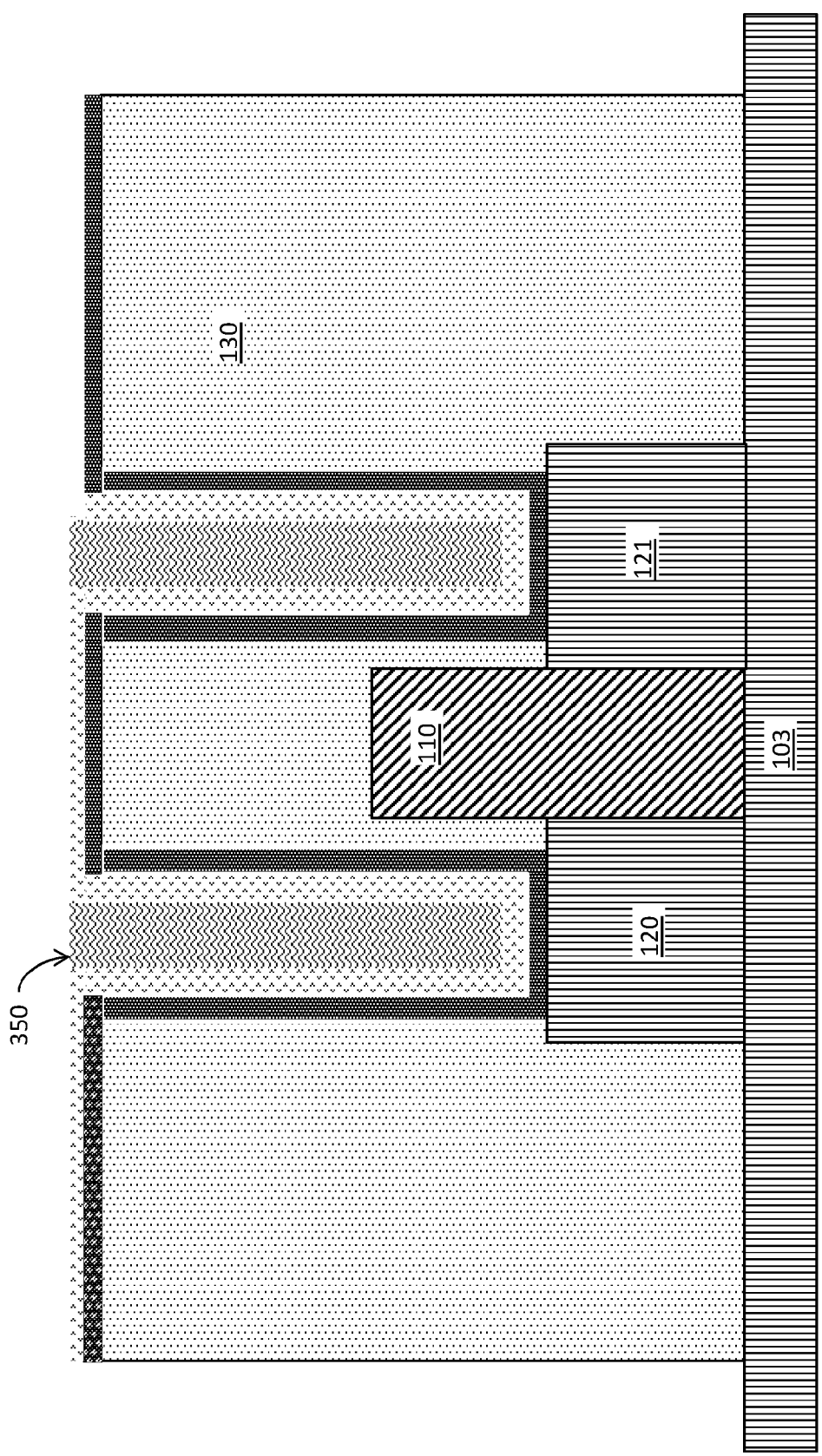
FIG. 7 shows the device of FIG. 6 after the deposition of additional metal. The etch stop layer is disposed between and adjacent to the first layer comprising titanium, titanium nitride or a combination thereof and the metal fill.

FIG. 7 is a cross-sectional side view after depositing a second layer of metal on the etching-modified metal layer 322 and planarization (typically by chemical mechanical planarization, CMP) to form a metal filled trench 350. The second layer of metal can be the same metal as the first layer or the second layer of metal can be a different metal. It is contemplated that additional etch and deposition steps may be required to achieve the metal filled trench 350. Due to the presence of the etch stop layer the additional etching steps can be performed without damage to any underlying materials.

More specifically, the above described method can result in a semiconductor device comprising a filled feature wherein the filled feature comprises an etch stop layer comprising titanium aluminum carbide layer adjacent to and in direct contact with metal fill. In some aspects the metal fill can comprise tungsten. The filled feature may be a metal gate, a metal contact, a capacitor, or a backend of the line interconnect. In some embodiments the etch stop layer is disposed between a titanium containing layer and the metal fill. In some embodiments the titanium containing layer comprises titanium, titanium nitride or a combination thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of forming a semiconductor device comprising:
   depositing a conductive underlying layer in a cavity of a semiconductor device, a surface of the conductive underlying layer in contact with a surface of a source or drain region;
   depositing an etch stop layer of titanium aluminum carbide on the conductive underlying layer;
   depositing a first layer of metal on the etch stop layer;

etching the first layer of metal with an etchant comprising NF$_3$ to create an etch-modified surface of the first layer of metal, the etch stop layer of titanium aluminum carbide acting as an etch stop while etching the first layer; and depositing a second layer of metal on the etch-modified surface of the first layer of metal.

2. The method of claim 1, wherein the cavity is a trench.

3. The method of claim 2, wherein the trench is a high aspect ratio trench.

4. The method of claim 1, wherein the first layer of metal is tungsten.

5. The method of claim 1, wherein etching is anisotropic etching using a generated plasma under an environment of a nitride containing gas NF$_3$.

6. The method of claim 1, wherein the method further comprises surface treating the etch-modified surface of the first layer of metal with an environment of mixed gases.

7. The method of claim 6, wherein the underlying layer comprises a multiplicity of layers.

8. The method of claim 1, wherein the etch stop layer has a thickness of 0.5 to 10 nanometers.

9. A method of making a semiconductor structure comprising:

creating a cavity in a semiconductor device;

depositing an underlying layer in the cavity, a surface of the conductive underlying layer in contact with a surface of a source or drain region;

depositing an etch stop layer of titanium aluminum carbide on the underlying layer;

depositing a first layer of tungsten on the etch stop layer;

etching the first layer of tungsten with an etchant comprising NF$_3$ to create an etch-modified surface of the first layer of tungsten, the etch stop layer of titanium aluminum carbide acting as an etch stop while etching the first layer; and depositing a second layer of tungsten on the etch-modified surface of the first layer of tungsten.

10. The method of claim 9, wherein the cavity is a trench.

11. The method of claim 10, wherein the trench is a high aspect ratio trench.

12. The method of claim 9, wherein etching is anisotropic etching using a generated plasma under an environment of a nitride containing gas NF$_3$.

13. The method of claim 9, wherein the method further comprises surface treating the etch-modified surface of the first layer of tungsten with an environment of mixed gases.

14. The method of claim 13, wherein the underlying layer comprises a multiplicity of layers.

15. The method of claim 9, wherein the etch stop layer has a thickness of 0.5 to 10 nanometers.

16. A semiconductor device comprising:

a filled feature;

a conductive underlying layer, a surface of the conductive underlying layer in contact with a surface of a source or drain region; and a metal fill;

wherein the filled feature comprises an etch stop layer comprising a titanium aluminum carbide layer disposed between and in direct contact with the underlying layer and the metal fill; and wherein the underlying layer comprises titanium, titanium nitride, cobalt, nickel, platinum, nickel platinum titanium, or a combination thereof.

17. The semiconductor device of claim 16, wherein the metal fill comprises tungsten.

18. The semiconductor device of claim 16, wherein the filled feature is a high aspect ratio trench.

19. The semiconductor device of claim 16, wherein the etch stop layer has a thickness of 0.5 to 10 nanometers.

* * * * *